US006847524B2

(12) United States Patent
Tomioka et al.

(10) Patent No.: US 6,847,524 B2
(45) Date of Patent: Jan. 25, 2005

(54) ELECTRONIC APPARATUS HAVING COOLING UNIT FOR COOLING HEAT-GENERATING COMPONENT

(75) Inventors: Kentaro Tomioka, Sayama (JP); Hiroshi Nakamura, Ome (JP)

(73) Assignee: Kabushiki Kaisha Toshiba, Tokyo (JP)

(*) Notice: Subject to any disclaimer, the term of this patent is extended or adjusted under 35 U.S.C. 154(b) by 74 days.

(21) Appl. No.: 10/164,017

(22) Filed: Jun. 7, 2002

(65) Prior Publication Data

US 2002/0186532 A1 Dec. 12, 2002

(30) Foreign Application Priority Data

Jun. 8, 2001 (JP) ........................................ 2001-174423

(51) Int. Cl.[7] .............................................. H05K 7/20
(52) U.S. Cl. .................. 361/695; 165/80.3; 165/121; 165/185; 257/722; 454/184; 361/703; 361/715; 361/697
(58) Field of Search ................. 165/80.3, 121, 165/122, 126, 185; 257/722; 361/687, 690, 694–697, 715; 454/184; 62/259.2

(56) References Cited

U.S. PATENT DOCUMENTS

| 5,694,294 A | | 12/1997 | Ohashi et al. | |
| 5,867,365 A | * | 2/1999 | Chiou | 361/690 |
| 6,111,748 A | * | 8/2000 | Bhatia | 361/695 |
| 6,348,748 B1 | * | 2/2002 | Yamamoto | 310/62 |

FOREIGN PATENT DOCUMENTS

| JP | 2-31191 | 2/1990 |
| JP | 4-15893 | 2/1992 |
| JP | 7-141062 | 6/1995 |
| JP | 8-137579 | 5/1996 |
| JP | 2000-227823 | 8/2000 |

OTHER PUBLICATIONS

"Notification of the First Office Action" from the Chinese Patent Office, citing U.S. Appl. No. 5,694,294, dated Mar. 5, 2004.
English Language Translation of "Notification of the First Office Action" from the Chinese Patent Office, citing U.S. Appl. No. 5,694,294, dated Mar. 5, 2004.
Japanese Patent Office Action dated Nov. 18, 2003, and English translation thereof.

* cited by examiner

Primary Examiner—Gregory D. Thompson
(74) Attorney, Agent, or Firm—Finnegan, Henderson, Farabow, Garrett & Dunner, L.L.P.

(57) ABSTRACT

An electronic apparatus comprises a housing containing a heat-generating component, and a cooling unit. The cooling unit includes a heat sink thermally connected to the heat-generating component, a first air passage for guiding air outside the housing to the heat sink and guiding air heated by heat exchange with the heat sink to the outside of the housing, and a second air passage for guiding air within the housing to the outside of the housing.

14 Claims, 9 Drawing Sheets great part of the microprocessor-cooling performance depends upon the temperature difference between the cooling air and heat sink (microprocessor), and the amount of cooling air.

ELECTRONIC APPARATUS HAVING COOLING UNIT FOR COOLING HEAT-GENERATING COMPONENT

CROSS-REFERENCE TO RELATED APPLICATIONS

This application is based upon and claims the benefit of priority from the prior Japanese Patent Application No. 2001-174423, filed Jun. 8, 2001, the entire contents of which are incorporated herein by reference.

BACKGROUND OF THE INVENTION

1. Field of the Invention

This invention relates to an electronic apparatus having a cooling unit for cooling a heat-generating component such as a semiconductor package.

2. Description of the Related Art

An electronic apparatus such as a portable computer contains a microprocessor for processing information. In microprocessors of this type, the consumption of power is being more and more increased in accordance with increases in processing speed or functionality, and the amount of heat generated is being increased proportionally. Accordingly, to maintain stable operation of the electronic apparatus, it is necessary to increase the degree of heat dissipation of the microprocessor.

To this end, a conventional electronic apparatus is equipped with a cooling unit using air for cooling its microprocessor. This cooling unit includes a heat sink for absorbing and dissipating the heat of the microprocessor, and an electromotive fan for supplying cooling air to the heat sink.

The heat sink has a heat-receiving section thermally connected to the microprocessor, radiator fins and cooling air passages for passing cooling air. The cooling air passages are formed along the heat-receiving section and radiator fins. The downstream ends of the cooling air passages oppose an exhaust port formed in a sidewall or the real wall of the housing.

The electromotive fan includes a fan casing with suction and discharge ports, and an impeller contained in the fan casing. The impeller draws air through the suction port, and discharges the drawn air into the cooling air passages through the discharge port. The discharged air serves as cooling air, and is heated by heat exchange with the heat sink while it is passing through the cooling air passages. The cooling air having absorbed the heat of the heat sink is discharged to the outside of the housing through the exhaust port.

In the conventional cooling unit, the cooling air passing through the cooling air passages is the main coolant for absorbing the heat of the microprocessor. Therefore, the greater part of the microprocessor-cooling performance depends upon the temperature difference between the cooling air and heat sink (microprocessor), and the amount of cooling air.

However, the heat of the microprocessor is discharged to the interior of the housing, as well as to the heat sink. Since the housing contains a plurality of circuit components such as a power supply unit that generates heat during operation, the air in the housing is heated by the microprocessor and circuit components. Therefore, the temperature difference between the heat sink and the air within the housing to be blown as cooling air onto the heat sink by the electromotive fan is small.

This means that the heat exchange between the cooling air and heat sink cannot be executed efficiently, thereby degrading the microprocessor-cooling performance.

To overcome this problem, a cooling unit has been recently available, which uses outside fresh air to cool the heat sink. In this cooling unit, a sufficient temperature difference can be secured between the cooling air and heat sink, which enhances the microprocessor-cooling performance.

Since, however, this cooling unit is used mainly to cool the microprocessor, it cannot positively draw and discharge the air within the housing. Accordingly, the interior of the housing is easily filled with the heat emitted from the other circuit components. Thus, the internal temperature of the housing is inevitably increased, which may cause the housing itself to become hot and require heat-resistant circuit components.

BRIEF SUMMARY OF THE INVENTION

It is an object of the present invention to provide an electronic apparatus capable of uniformly cooling its heat generating component and housing, thereby enhancing the heat dissipation effect.

To attain the objects, according to a first aspect of the invention, there is provided an electronic apparatus comprising: a housing containing a heat-generating component and a cooling unit. The cooling unit includes a heat sink thermally connected to the heat-generating component, a first air passage which guides air outside the housing to the heat sink and guides air heated by heat exchange with the heat sink to an outside of the housing, and a second air passage which guides air within the housing to the outside of the housing.

In the above structure, cold air outside the housing is guided as cooling air into the heat sink. Accordingly, the temperature difference between the cooling air and the heat sink is large, which enables efficient heat exchange between the air and heat sink. Further, the air within the housing is discharged to the outside of the housing through the second air passage. As a result, the air flow in the housing is properly maintained, which substantially prevents the heat generated by the heat-generating component from being accumulated in the housing. Thus, the heat-generating component and housing are cooled in a well-balanced manner.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Referring to FIGS. 1–5, a portable computer according to a first embodiment of the invention will be described.

Figure 1:
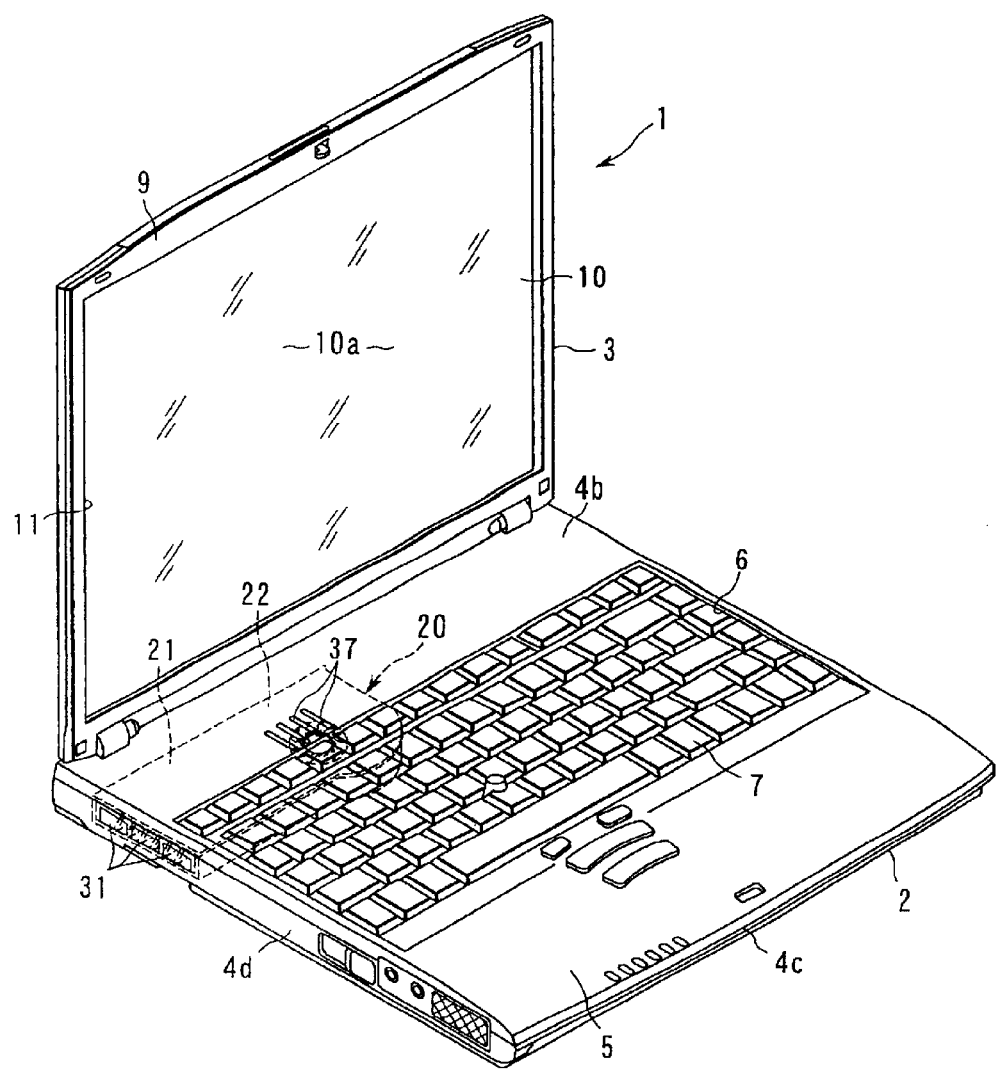
FIG. 1 is a perspective view illustrating a portable computer according to a first embodiment of the invention.

FIG. 1 shows a portable computer 1 as an electronic apparatus. The portable computer 1 comprises a computer main unit 2, and a display unit 3 supported by the main unit 2. The computer main unit 2 includes a housing 4. The housing 4 is in the shape of a flat box, and includes a bottom 4a, upper surface 4b, front wall 4c, right and left sidewalls 4d and rear wall 4e. The front wall 4c, sidewalls 4d and rear wall 4e extend downwardly from the respective outer peripheral edges of the upper surface 4b, thereby forming the peripheral walls of the housing 4. The upper surface 4b of the housing 4 has a palm rest 5 and keyboard attachment portion 6. The palm rest 5 forms the front edge portion of the housing 4. The keyboard attachment portion 6 is located behind the palm rest 5. A keyboard 7 is attached to the keyboard attachment portion 6.

The display unit 3 comprises a display housing 9, and a liquid crystal display panel 10 housed in the display housing 9. The display housing 9 is pivotably coupled to the rear end of the housing 4 by a hinge unit (not shown). The liquid crystal display panel 10 has a display screen 10a for displaying an image. The display screen 10a is exposed to the outside through an opening 11 formed in a front surface of the display housing 9.

As shown in FIGS. 2–5, the housing 4 houses a printed circuit board 13. The printed circuit board 13 is located parallel to the bottom 4a of the housing 4. The printed circuit board 13 has an upper surface 13a opposing the upper surface 4b of the housing 4 and keyboard 7. A semiconductor package 14 is mounted on the upper surface 13a of the board 13. The semiconductor package 14 forms a microprocessor as the central core of the portable computer 1. The semiconductor package 14 is located at the left end of the rear portion of the housing 4.

The semiconductor package 14 includes a base plate 15, and an IC chip 16 provided on the central portion of the upper surface of the base plate 15. The IC chip 16 generates a large amount of heat during its operation, and hence needs to be cooled in order to maintain stable operation. Therefore, the semiconductor package 14 is considered a first heat-generating element.

Figure 2:
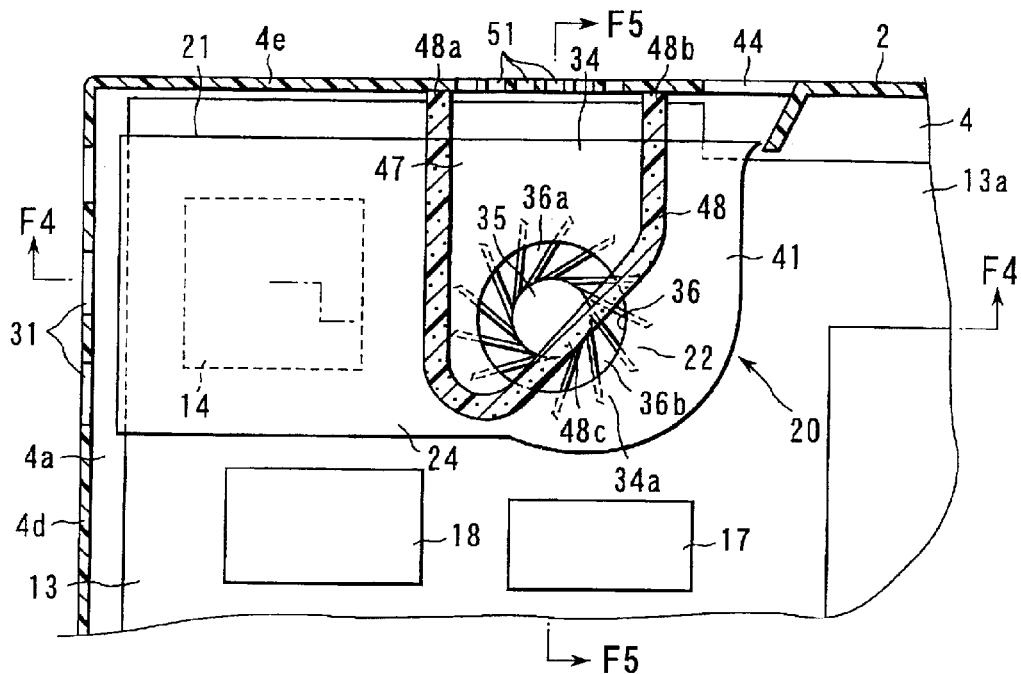
FIG. 2 is a sectional view illustrating the positional relationship between the housing and cooling unit incorporated in the computer of the first embodiment.

As shown in FIG. 2, a power supply unit 17 and a chip set 18 comprising a plurality of chips are mounted on the upper surface 13a of the printed circuit board 13. The power supply unit 17 and chip set 18 are located around the semiconductor package 14. The power supply unit 17 is located closer to the center of the housing 4 than the semiconductor package 14. The power supply unit 17 and chip set 18 generate heat during operation, like the semiconductor package 14. Therefore, the power supply unit 17 and chip set 18 are considered, as a whole, a second heat-generating element. The calorific output of the power supply unit 17 and chip set 18 is lower than that of the semiconductor package 14.

The housing 4 also houses a cooling unit 20. The cooling unit 20 includes a heat sink 21 and electromotive fan 22. The heat sink 21 and electromotive fan 22 are formed integrally, and are located at the corner between the left sidewall 4d and rear wall 4d of the housing 4.

The heat sink 21 is formed of a metal of high heat conductivity, such as aluminum. The heat sink 21 is in the shape of a flat box, and extends along the length of the housing 4. The heat sink 21 is formed of a base 23 and top plate 24. The base 23 has a bottom plate 25, and side plates 26a and 26b standing upright from the front and rear edges of the bottom plate 25, respectively. A plurality of radiator fins 27 are formed on the upper surface of the bottom plate 25. The radiator fins 27 extend along the length of the heat sink 21, parallel to each other at regular intervals. The top plate 24 fixedly bridges the upper edges of the side plates 26a and 26b, and opposes the bottom plate 25 and radiator fins 27.

A first air passage 29 is formed between the base 23 and top plate 24, extending along the length of the heat sink 21. The radiator fins 27 on the bottom plate 25 are located within the first air passage 29. The air passage 29 has a discharge port 30 at its downstream end. The discharge port 30 is adjacent to the left sidewall 4d of the housing 4, and opposes first outlets 31 formed in the sidewall 4d.

The base 23 of the heat sink 21 is fixed to the upper surface 13a of the printed circuit board 13. The bottom plate 25 of the base 23 opposes the upper surface 13a of the printed circuit board 13. The lower surface of the bottom plate 25 serves as a flat heat-receiving surface 32. The heat-receiving surface 32 is thermally connected to the IC chip 16 of the semiconductor package 14 via a thermal conductive sheet or grease (not shown). Accordingly, the heat of the IC chip 16 is transmitted to the heat-receiving surface 32 of the heat sink 21 and then to the base 23 and top plate 24, whereby it is dissipated.

Figure 4:
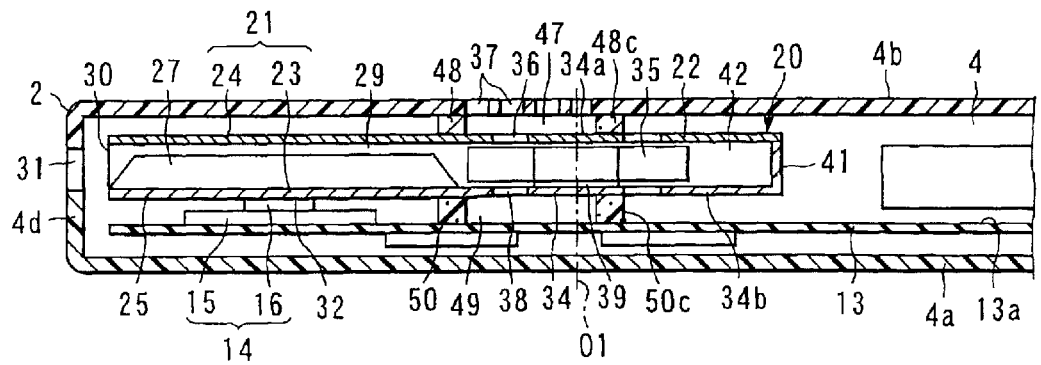
FIG. 4 is a sectional view taken along line F4—F4 of FIG. 2.

As shown in FIG. 4, the electromotive fan 22 includes a fan casing 34 and a centrifugal impeller 35. The fan casing 34 is a hollow box formed integral with the heat sink 21. The fan casing 34 is located at the upstream end of the first air passage 29.

The fan casing 34 has upper and bottom surfaces 34a and 34b. The upper surface 34a of the fan casing 34 is continuous with the top plate 24 of the heat sink 21 and is located just below the rear end portion of the upper surface 4b. A first suction port 36 is formed in the upper surface 34a. The first suction port 36 opposes first inlets 37 formed in the upper surface 4b. The bottom surface 34b of the fan casing 34 is continuous with the base 23 of the heat sink 21, and opposes the upper surface 13a of the printed circuit board 13. A second suction port 38 is formed in the bottom surface 34b just below the first suction port 36.

The impeller 35 is contained in the fan casing 34 with its axis-of-rotation O1 positioned vertically. The impeller 35 is located between the first and second suction ports 36 and 38 and upstream end of the first air passage 29.

The impeller 35 is rotated by a flat motor 39 if the temperature of the semiconductor package 14 exceeds an operation guarantee temperature. When the impeller 35 is rotating, air is introduced into the fan casing 34 through the first and second suction ports 36 and 38. This air is guided into the fan casing 34 from the peripheral portion of the impeller 35.

Figure 3:
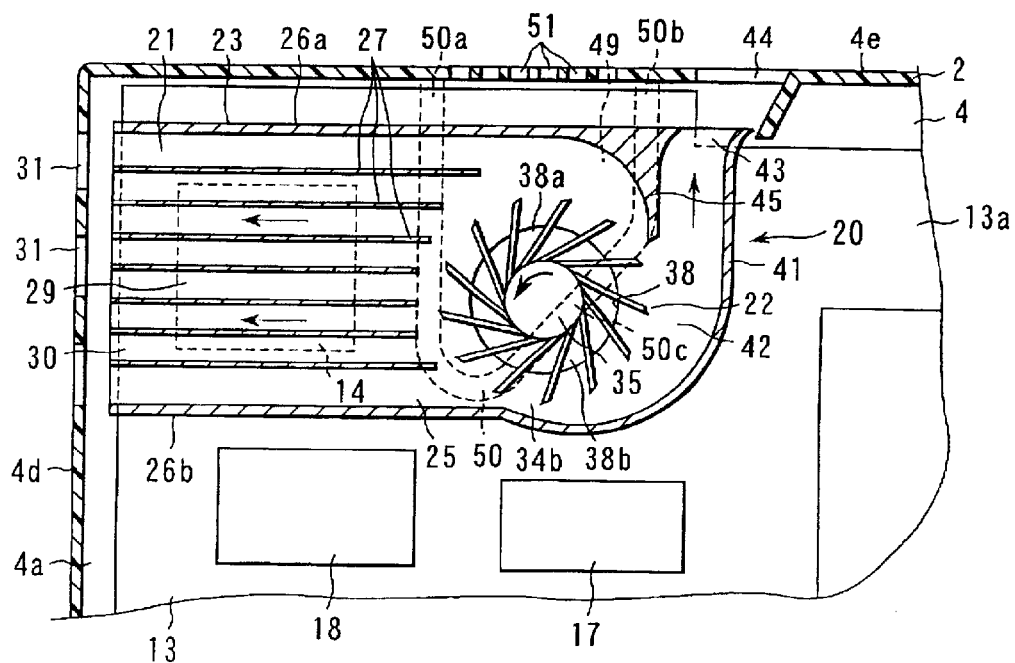
FIG. 3 is a sectional view illustrating the positional relationship between the housing and the heat sink and electromotive fan of the cooling unit, which are incorporated in the computer of the first embodiment.

As shown in FIGS. 3 and 4, the fan casing 34 has an extension 41 extending to the right side of the impeller 35. The extension 41 defines a second air passage 42 at the right side of the impeller 35. The second air passage 42 is located at the opposite side of the impeller 35 with respect to the first air passage 29. In other words, the impeller 35 is interposed between the first and second air passages 29 and 42. Further, the second air passage 42 extends in a direction different from that of the first air passage 29, i.e., it extends from the impeller 35 toward the rear side of the housing 4. The second air passage 42 has a discharge port 43 at its downstream end. The discharge port 43 is adjacent to the rear wall 4e of the housing 4, and opposes a second outlet 44 formed in the rear wall 4e.

As shown in FIG. 3, the fan casing 34 has a partition wall 45 that partitions the first and second air passages 29 and 42. The partition wall 45 extends from the inner surface of the fan casing 34 toward the impeller 35. The distal end of the partition wall 45 is located close to the outer peripheral portion of the impeller 35. Accordingly, a part of the outer peripheral portion of the impeller 35 is exposed to the upstream end of the first air passage 29, and the other part is exposed to the upstream end of the second air passage 42. The exposure ratio of the impeller 35 to the first air passage 29 is higher than that of the impeller 35 to the second air passage 42.

Accordingly, part of the air introduced into the first and second suction ports 36 and 38 in accordance with the rotation of the impeller 35 is discharged into the first air passage 29 from the outer peripheral portion of the impeller 35. Further, the other part of the air is discharged into the second air passage 42 from the outer peripheral portion of the impeller 35.

Figure 5:
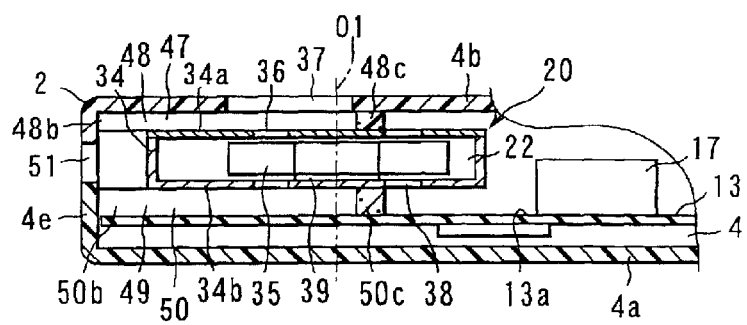
FIG. 5 is a sectional view taken along line F5—F5 of FIG. 2.

As shown in FIGS. 2, 4 and 5, a first external air introduction passage 47 is formed between the upper surface 34a of the fan casing 34 and the upper surface 4b of the housing 4. The first external air introduction passage 47 is isolated from the interior of the housing 4 by a seal member 48. The seal member 48 is formed of a flexible material such as sponge. The seal member 48 is interposed between the upper surface 34a of the fan casing 34 and the upper surface 4b of the housing 4.

The seal member 48 has a pair of end portions 48a and 48b and an intermediate portion 48c. The end portions 48a and 48b are separate from each other in the longitudinal direction of the housing 4, and abut against the inner surface of the rear wall 4e of the housing 4. The intermediate portion 48c is located opposite to the end portions 48a and 48b. The intermediate portion 48c extends across the first suction port 36, thereby dividing the first suction port 36 into first and second areas 36a and 36b. The first area 36a opens to the first external air introduction passage 47 and is located at the upstream end of the first air passage 29. The second area 36b opens to the interior of the housing 4 that is displaced from the first external air introduction passage 47, and is located at the upstream end of the second air passage 42. The open area of the first area 36a is larger than that of the second area 36b.

As shown in FIGS. 3–5, a second external air introduction passage 49 is defined between the bottom surface 34b of the fan casing 34 and the upper surface 13a of the printed circuit board 13. The second external air introduction passage 49 is isolated from the interior of the housing 4 by a seal member 50. The seal member 50 is formed of a flexible material such as sponge. The seal member 50 is interposed between the bottom surface 34b of the fan casing 34 and the upper surface 13a of the printed circuit board 13.

The seal member 50 has a pair of end portions 50a and 50b and an intermediate portion 50c. The end portions 50a and 50b are separate from each other in the longitudinal direction of the housing 4, and abut against the inner surface of the rear wall 4e of the housing 4. The intermediate portion 50c is located opposite to the end portions 50a and 50b. The intermediate portion 50c extends across the second suction port 38, thereby dividing the second suction port 38 into first and second areas 38a and 38b. The first area 38a opens to the second external air introduction passage 49 and is located at the upstream end of the first air passage 29. The second area 38b opens to the interior of the housing 4 that is displaced from the second external air introduction passage 49, and is located at the upstream end of the second air passage 42. The open area of the first area 38a is larger than that of the second area 38b.

Further, as shown in FIGS. 2, 3 and 5, the rear wall 4e of the housing 4 has a plurality of second inlets 51. The second inlets 51 are located behind the fan casing 34 and oppose the upstream ends of the first and second external air introduction passages 47 and 49.

In the above-described structure, the IC chip 16 of the semiconductor package 14 generates heat when the portable computer 1 is being used. The heat of the IC chip 16 is transmitted to the heat-receiving surface 32 of the heat sink 21, and then to the base 23 and top plate 24. The heat is then discharged from the heat sink 21 to the interior of the housing 4.

When the temperatures of the semiconductor package 14 exceeds the operation guarantee temperature, the impeller 35 of the electromotive fan 22 rotates. In accordance with the rotation of the impeller 35, a negative pressure is created in the first and second suction ports 36 and 38, thereby introducing cold air from the outside of the housing 4 into the first and second external air introduction passages 47 and 49 through the first and second inlets 37 and 51.

The first and second external air introduction passages 47 and 49 communicate with the first areas 36a and 38a of the first and second suction ports 36 and 38, respectively. Accordingly, the air outside the housing 4, introduced into the first and second external air introduction passages 47 and 49, is guided as cooling air into the fan casing 34, where it is mainly discharged into the first air passage 29 from the outer peripheral portion of the impeller 35. This cooling air passes through the radiator fins 27 as indicated by arrows in FIG. 3, thereby cooling the heat sink 21 that receives the heat of the IC chip 16.

The cooling air absorbs, by heat exchange, the heat of the IC chip 16 transmitted to the heat sink 21. The cooling air, heated as a result of the heat exchange, is discharged to the outside of the housing 4 through the discharge port 30 of the first air passage 29 and the first outlets 31.

On the other hand, the second areas 36b and 38b of the first and second suction ports 36 and 38 of the electromotive fan 22 open to the interior of the housing 4. Accordingly, when the impeller 35 rotates, the air within the housing 4 is introduced into the fan casing 34 through the second areas 36b and 38b. As a result, a flow of cooling air directed to the first and second suction ports 36 and 38 occurs in the housing 4. This cooling air cools the power supply unit 17 and chip set 18.

The cooling air absorbs, by heat exchange, the heat of the power supply unit 17 and chip set 18. The cooling air, heated as a result of the heat exchange, is introduced into the fan casing 34 through the second areas 36b and 38b, and is then mainly discharged to the second air passage 42 from the outer peripheral portion of the impeller 35. This air is discharged to the outside of the housing 4 through the discharge port 43 of the second air passage 42 and the second outlet 44.

In the above-described structure, cold air from the outside of the housing 4, which is used as cooling air, can be directly guided to the heat sink 21 that receives the heat of the IC chip 16. Therefore, the temperature difference between the cooling air and heat sink 21 is large, which enables efficient heat exchange between the air and heat sink 21.

As a result, the IC-chip cooling performance is enhanced, and hence the operation temperature of the semiconductor package 14 of the microprocessor can be maintained at an appropriate value even when the semiconductor package 14 is driven at its maximum capacity.

Furthermore, the air within the housing 4 is discharged to the outside of the housing 4 through the second air passage 42 that is not included in the cooling system for the heat sink 21. Accordingly, the air flow in the housing 4 is properly maintained, which enables the heat generated by the power supply unit 17 and chip set 18 to be efficiently discharged to the outside of the housing 4. As a result, the cooling performance for the power supply unit 17 and chip set 18 is enhanced, and increases in the temperature of the housing 4 can be prevented.

In the above-described embodiment, the heat sink 21 is interposed between the electromotive fan 22 and sidewall 4d. In other words, the electromotive fan 22 is located at an inner portion of the housing 4, separate from the sidewall 4d. This means that the electromotive fan 22 is not easily influenced by the outside air temperature, and can draw air from inner portions of the housing 4 close to its center in which heat is liable to be accumulated, thereby substantially preventing local heat accumulation in the housing 4.

As a result, the semiconductor package 14, power supply unit 17, chip set 18 and housing 4 can be cooled in a well-balanced manner, further enhancing the heat dissipation performance of the portable computer 1.

In addition, in the cooling unit 20 constructed as above, the impeller 35 of the electromotive fan 22 is interposed between the first and second air passages 29 and 42. Accordingly, substantially the entire outer peripheral portion of the impeller 35 is surrounded by the upstream ends of the first and second air passages 29 and 42. This means that the flow of the cooling air discharged from the outer peripheral portion of the impeller 35 is not interrupted by the fan casing 34. As a result, a sufficient amount of cooling air can be supplied to the heat sink 21 from the outer peripheral portion of the impeller 35, while the air in the housing 4 can be efficiently discharged to the outside of the housing 4.

The first and second suction ports 36 and 38 of the fan casing 34 are divided into first areas 36a and 38a opening to the first and second external air introduction passages 47 and 49, and second areas 36b and 38b opening to the interior of the housing 4, respectively. Therefore, the single electromotive fan 22 can simultaneously introduce cold air outside the housing 4 into the heat sink 21, and discharge the air within the housing 4 to the outside of the housing 4.

Since only one electromotive fan 22 is sufficient for the two air passages in the housing 4 as aforementioned, the number of components required can be reduced, and hence the cost and weight of the portable computer 1 can be reduced.

Moreover, the first suction port 36 of the electromotive fan 22 communicates with the first inlets 37 formed in the upper surface 4b of the housing 4, and with the second inlets 51 formed in the rear wall 4e of the housing 4. Therefore, even if one of the first and second inlets 37 and 51 is clogged for some reason during the operation of the portable computer 1, the introduction of air to the electromotive fan 22 is not completely interrupted. This protects the function of supplying cooling air to the heat sink 21, and the function of drawing air from within the housing 4.

Figure 6:
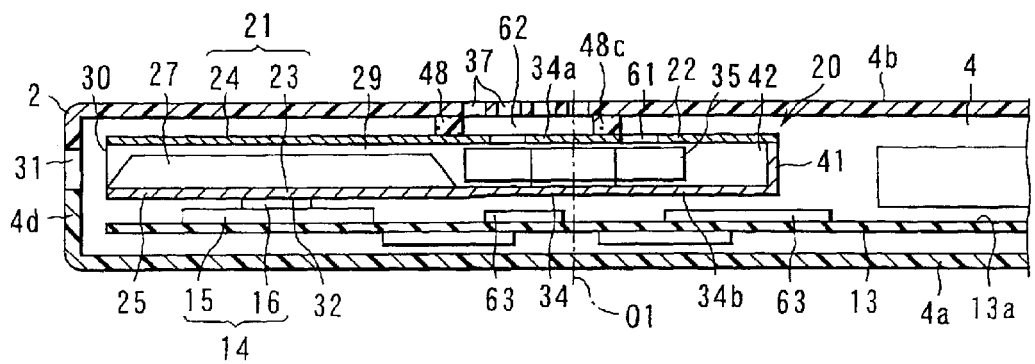
FIG. 6 is a sectional view illustrating the positional relationship between the housing and the heat sink and electromotive fan of the cooling unit, which are incorporated in a portable computer according to a second embodiment.

The invention is not limited to the above-described first embodiment. Referring now to FIG. 6, a second embodiment will be described.

The second embodiment differs from the first embodiment in the structure of the fan casing 34. In the second embodiment, the fan casing 34 has a single suction port 61. The suction port 61 is formed only in the upper surface 34a of the fan casing 34. An external air introduction passage 62 is formed between the upper surface 34a of the fan casing 34 and the upper surface 4b of the housing 4. The external air introduction passage 62 is isolated from the interior of the housing 4 by a seal member 48, as in the first embodiment. The suction port 61 opens to the external air introduction passage 62.

In the above-described structure, cold air outside the housing 4 is introduced into the suction port 61 through the external air introduction passage 62 above the fan casing 34. This means that the space between the bottom surface 34b of the fan casing 34 and the upper surface 13a of the printed circuit board 13 is not used as a passage for introducing cold air outside the housing 4. Accordingly, a plurality of short-size circuit components 63 can be mounted on the portions of the upper surface 13a of the printed circuit board 13, which oppose the bottom surface 34b of the fan casing 34.

Figure 7:
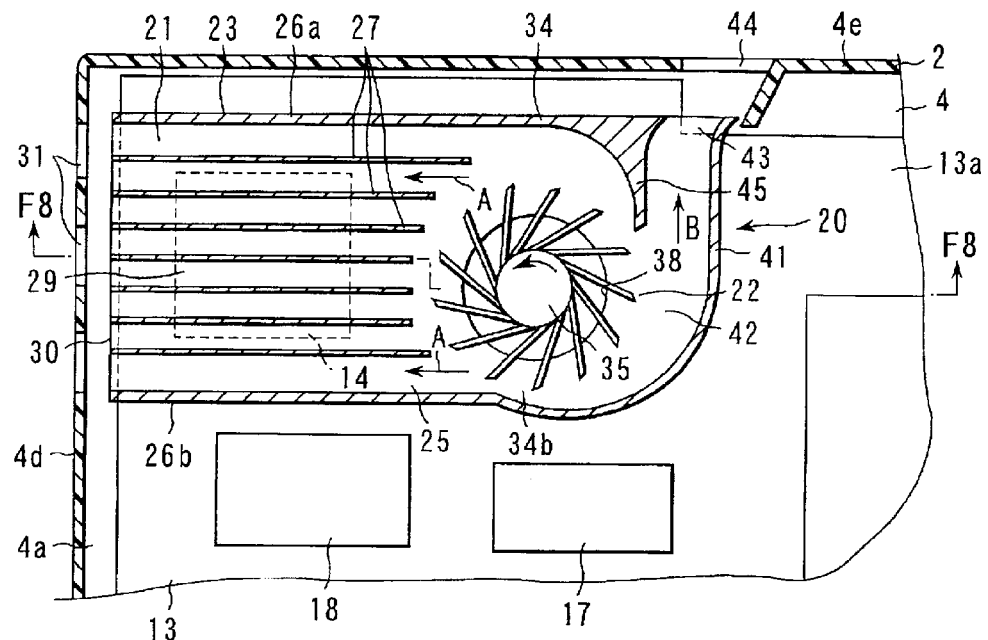
FIG. 7 is a sectional view illustrating the positional relationship between the housing and the heat sink and electromotive fan of the cooling unit, which are incorporated in a portable computer according to a third embodiment.
Figure 8:
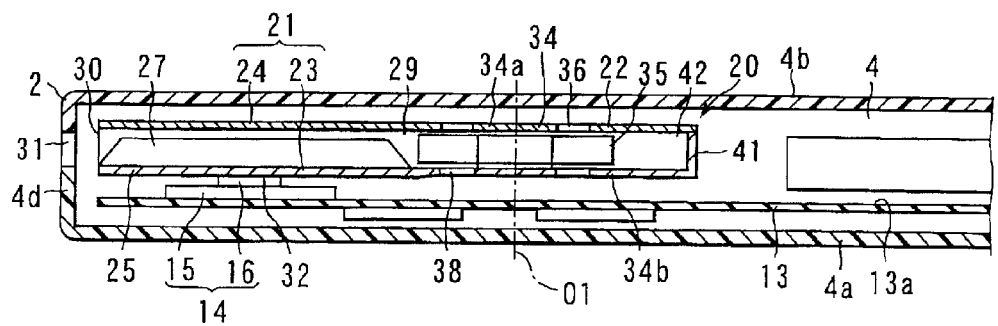
FIG. 8 is a sectional view taken along line F8—F8 of FIG. 7.

Referring to FIGS. 7 and 8, a third embodiment of the invention will be described.

In the third embodiment, both the first and second suction ports 36 and 38 of the fan casing 34 open to the interior of the housing 4. In this structure, when the impeller 35 of the electromotive fan 22 rotates, the air in the housing 4 is introduced into the fan casing 34 through the first and second suction ports 36 and 38. Part of the introduced air is discharged from the outer peripheral portion of the impeller 35 to the upstream end of the first air passage 29 as indicated by arrows A in FIG. 7. The other part of the air is discharged from the outer peripheral portion of the impeller 35 to the upstream end of the second air passage 42 as indicated by arrow B in FIG. 7. Thus, the air in the housing 4 is simultaneously introduced into the heat sink 21 through the first air passage 29, and discharged to the outside of the housing 4 through the second air passage 42.

In this structure, substantially the entire outer peripheral portion of the impeller 35 is surrounded by the upstream ends of the first and second air passages 29 and 42. This means that the flow of the cooling air discharged from the outer peripheral portion of the impeller 35 is not interrupted by the fan casing 34. As a result, a sufficient amount of cooling air can be supplied to the heat sink 21 from the outer peripheral portion of the impeller 35, while the air in the housing 4 can be efficiently discharged to the outside of the housing 4. Since the heat dissipation performance in the housing 4 is thus enhanced, the semiconductor package 14, power supply unit 17, chip set 18 and housing 4 can be cooled in a well-balanced manner.

Figure 9:
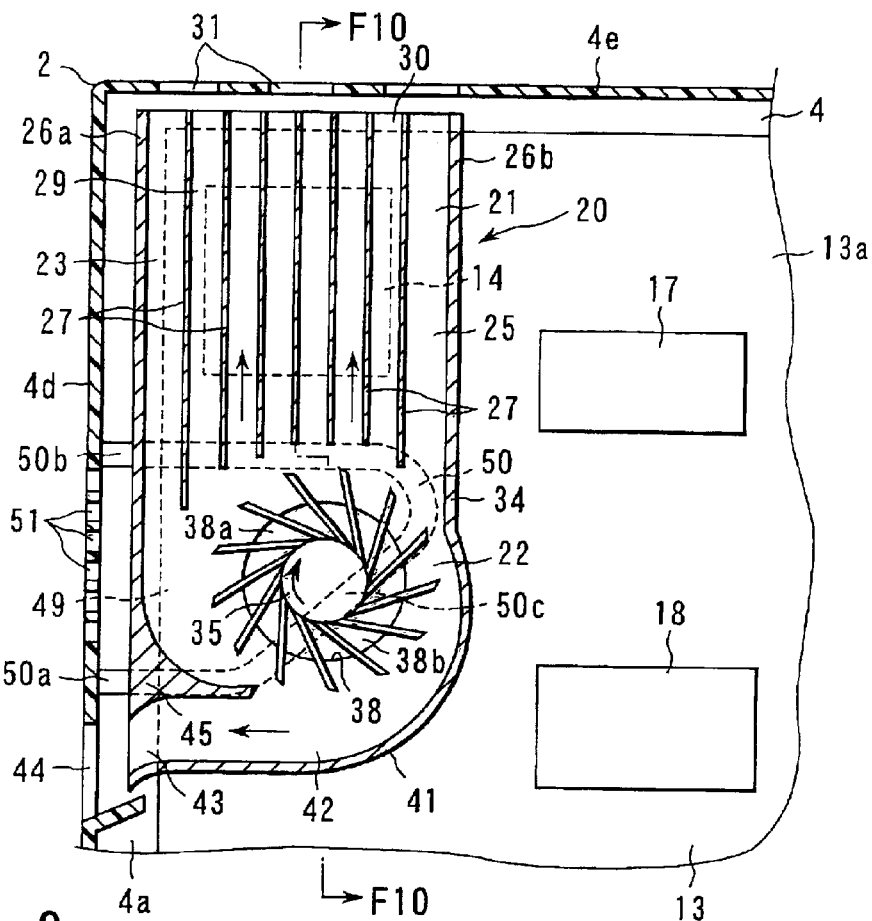
FIG. 9 is a sectional view illustrating the positional relationship between the housing and the heat sink and electromotive fan of the cooling unit, which are incorporated in a portable computer according to a fourth embodiment.
Figure 10:
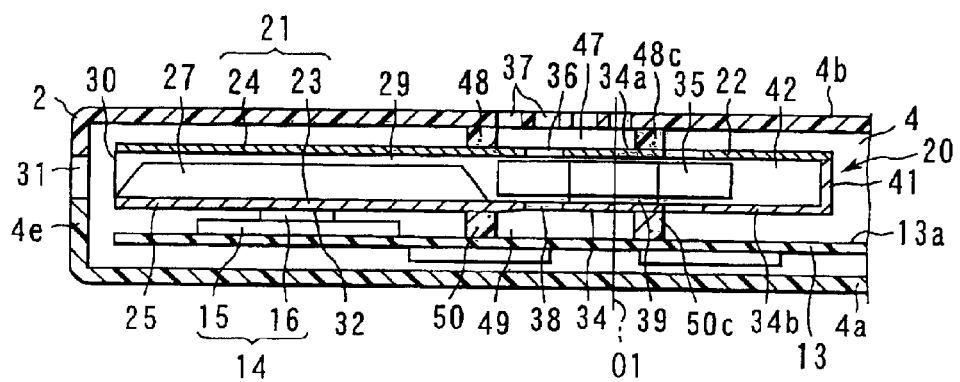
FIG. 10 is a sectional view taken along line F10—F10 of FIG. 9.
Figure 11:
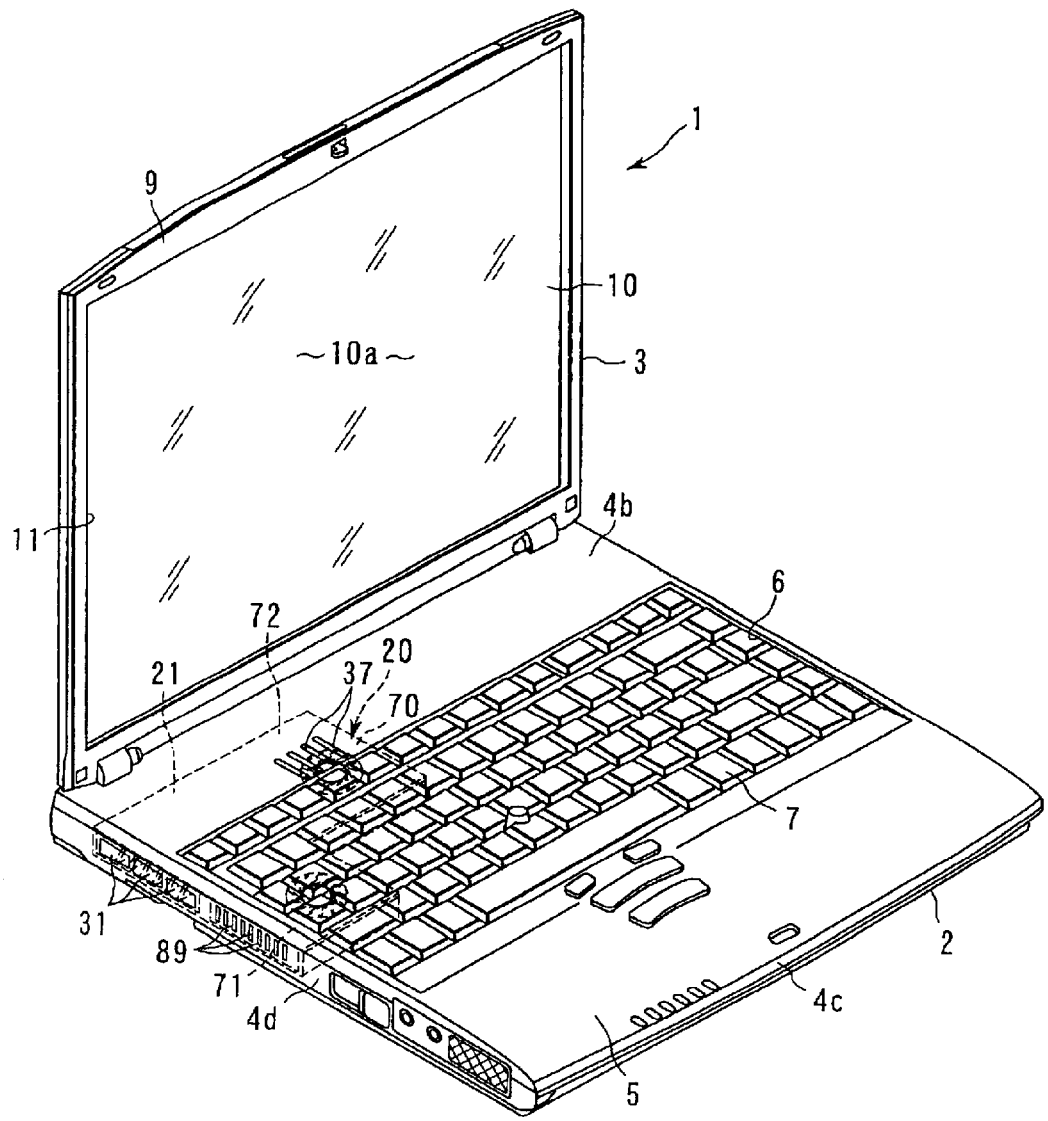
FIG. 11 is a perspective view illustrating a portable computer according to a fifth embodiment of the invention.

Referring to FIGS. 9 and 10, a fourth embodiment of the invention will be described.

The fourth embodiment differs from the first embodiment in the position of the cooling unit 20 with respect to the housing 4. The basic structure of the cooling unit 20 is similar to that in the first embodiment.

As shown in FIG. 9, the heat sink 21 is housed in the housing 4, extending along the depth of the housing 4. The discharge port 30 of the first air passage 29 of the heat sink 21 is adjacent to the rear wall 4e of the housing 4, and opposes the first outlets 31 formed in the rear wall 4e.

The electromotive fan 22 is located in front of the heat sink 21. The discharge port 43 of the second air passage 42 of the fan casing 34 is adjacent to the sidewall 4d, and opposes the second outlet 44 formed in the sidewall 4d. Further, second inlets 51 are formed in the sidewall 4d. The second inlets 51 communicate with the first areas 36a and 38a of the first and second suction ports 36 and 38 via the first and second external air introduction passages 47 and 49.

In this structure, when the impeller 35 of the electromotive fan 22 rotates, cold air outside the housing 4 is introduced into the fan casing 34 through the first and second inlets 37 and 51, the first and second external air introduction passages 47 and 49, and the first areas 36a and 38a of the first and second suction ports 36 and 38. The introduced air is mainly discharged to the first air passage 29 from the outer peripheral portion of the impeller 35, thereby cooling the heat sink 21.

The air within the housing 4 is drawn into the fan casing 34 through the second areas 36b and 38b of the first and second suction ports 36 and 38. The drawn air is mainly discharged to the second air passage 42 from the outer peripheral portion of the impeller 35 as indicated by an arrow in FIG. 9. This air is discharged to the outside of the housing 4 through the discharge port 43 of the second air passage 42 and the second outlet 44.

Thus, while cooling air is supplied to the heat sink 21, the air heated in the housing 4 can be discharged to the outside of the housing 4 through a passage different from that for passing the cooling air, as in the first embodiment.

Referring then to FIGS. 11–15, a fifth embodiment of the invention will be described.

The fifth embodiment differs from the first embodiment in that, in the former, the cooling unit 20 includes first and second electromotive fans 70 and 71. The other structures of the former are similar to those of the latter. Therefore, in the fifth embodiment, elements similar to those of the first embodiment are denoted by corresponding reference numerals, and no detailed description will be given thereof.

Figure 13:
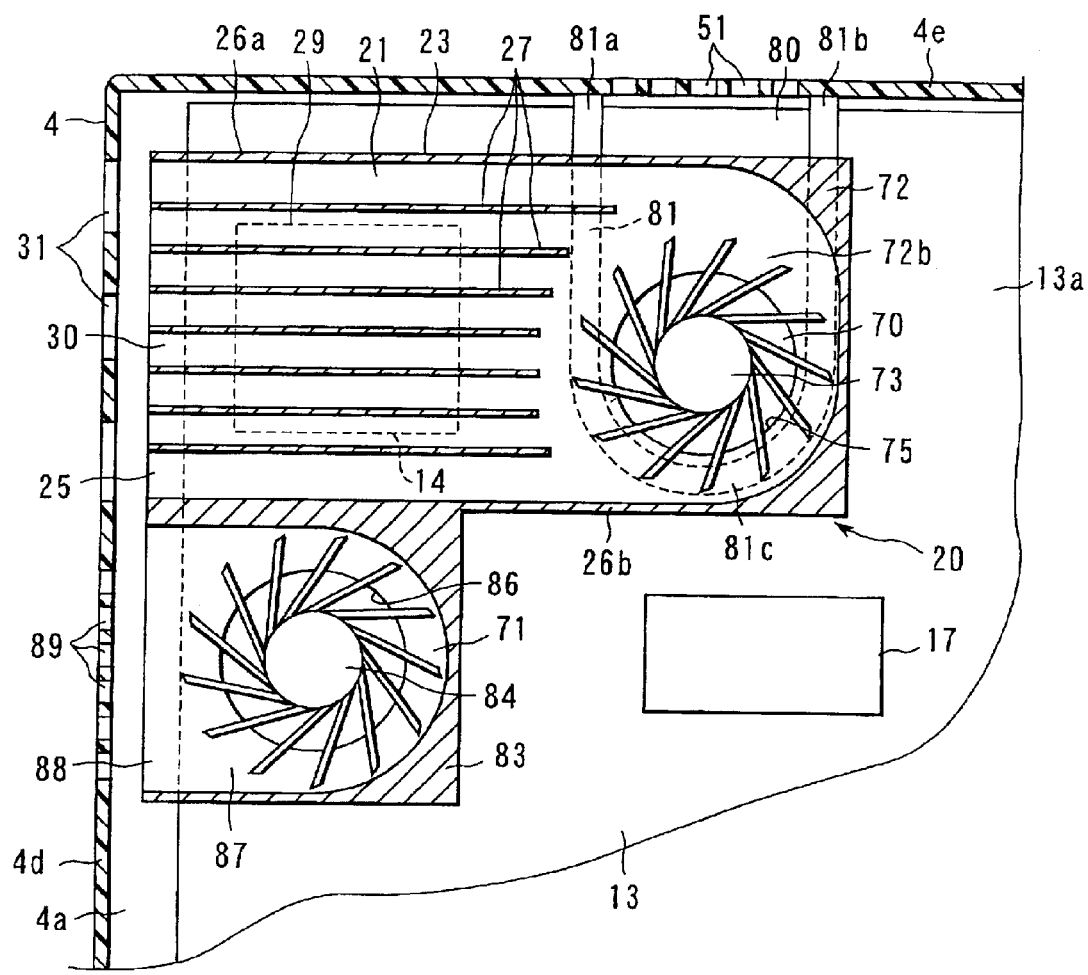
FIG. 13 is a sectional view illustrating the positional relationship between the housing and the heat sink and first and second electromotive fans of the cooling unit, which are incorporated in the computer of the fifth embodiment.
Figure 14:
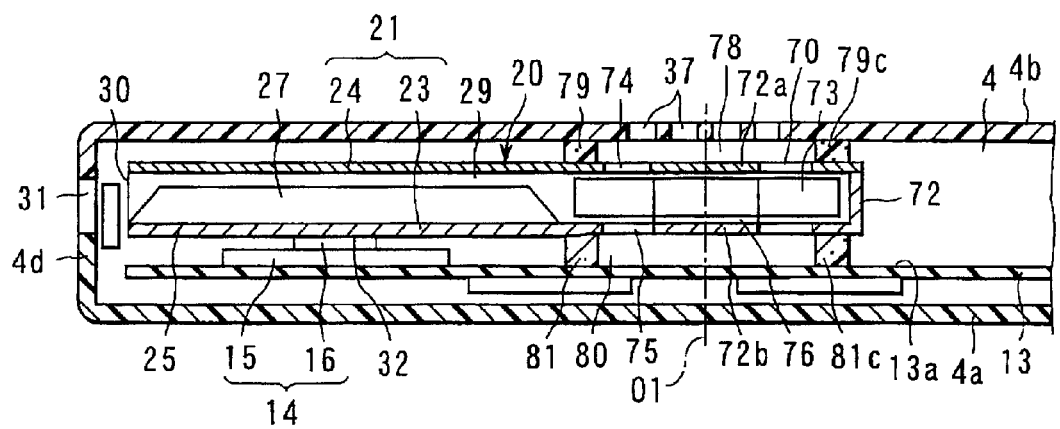
FIG. 14 is a sectional view taken along line F14—F14 of FIG. 12.

As shown in FIGS. 13 and 14, the first electromotive fan 70 introduces cold air outside the housing 4 into the heat sink 21. The first electromotive fan 70 comprises a flat-box-shaped fan casing 72, and an impeller 73 housed in the casing 72. The fan casing 72 is formed integral with the heat sink 21 and located at the upstream end of the first air passage 29.

The fan casing 72 has upper and bottom surfaces 72a and 72b. The upper surface 72a is continuous with the top plate 24 of the heat sink 21, and is located just below the rear end portion of the upper surface 4b of the housing 4. A first suction port 74 is formed in the upper surface 72a, opposing first inlets 37 formed in the upper surface 4b. The bottom surface 72b is continuous with the base 23 of the heat sink 21 and opposes the upper surface 13a of the printed circuit board 13. A second suction port 75 is formed in the bottom surface 72b.

As shown in FIG. 14, the impeller 73 is contained in the fan casing 72 with its axis-of-rotation O1 positioned vertically. The impeller 73 is located between the first and second suction ports 74 and 75 and the upstream end of the first air passage 29.

The impeller 73 is rotated by a flat motor 76 when the temperature of the semiconductor package 14 exceeds the operation guarantee temperature. In accordance with the rotation of the impeller 73, air is introduced into the fan casing 72 through the first and second suction ports 74 and 75, and is then discharged into the first air passage 29 from the outer peripheral portion of the impeller 73.

Figure 12:
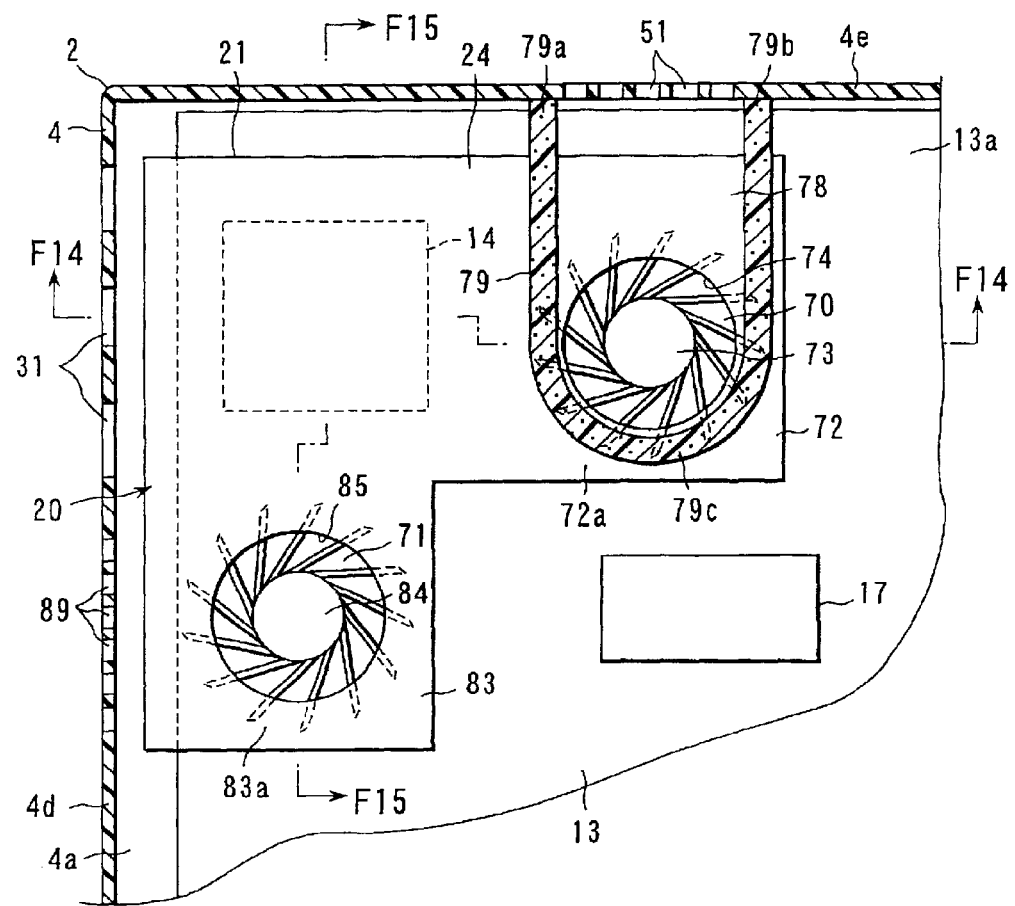
FIG. 12 is a sectional view illustrating the positional relationship between the housing and cooling unit incorporated in the computer of the fifth embodiment.

As shown in FIGS. 12 and 14, a first external air introduction passage 78 is formed between the upper surface 72a of the fan casing 72 and the upper surface 4b of the housing 4. The first external air introduction passage 78 is isolated from the interior of the housing 4 by a seal member 79. The seal member 79 is formed of a flexible material such as sponge. The seal member 79 is interposed between the upper surface 72a of the fan casing 72 and the upper surface 4b of the housing 4.

The seal member 79 has a pair of end portions 79a and 79b and an intermediate portion 79c. The end portions 79a and 79b are separate from each other in the longitudinal direction of the housing 4, and abut against the inner surface of the rear wall 4e of the housing 4. The intermediate portion 79c is arcuate such that it surrounds the edge of the first suction port 74. Accordingly, the first external air introduction passage 78 extends from the first suction port 74 to the rear wall 4e.

A second external air introduction passage 80 is defined between the bottom surface 72b of the fan casing 72 and the upper surface 13a of the printed circuit board 13. The second external air introduction passage 80 is isolated from the interior of the housing 4 by a seal member 81. The seal member 81 is formed of a flexible material such as sponge. The seal member 81 is interposed between the bottom surface 72b of the fan casing 72 and the upper surface 13a of the printed circuit board 13.

The seal member 81 has a pair of end portions 81a and 81b and an intermediate portion 81c. The end portions 81a and 81b are separate from each other in the longitudinal direction of the housing 4, and abut against the inner surface of the rear wall 4e of the housing 4. The intermediate portion 81c is arcuate such that it surrounds the edge of the second suction port 75. Accordingly, the second external air introduction passage 80 extends from the second suction port 75 to the rear wall 4e. The first and second external air introduction passages 78 and 80 communicate with the second inlets 51 formed in the rear wall 4e of the housing 4.

Figure 15:
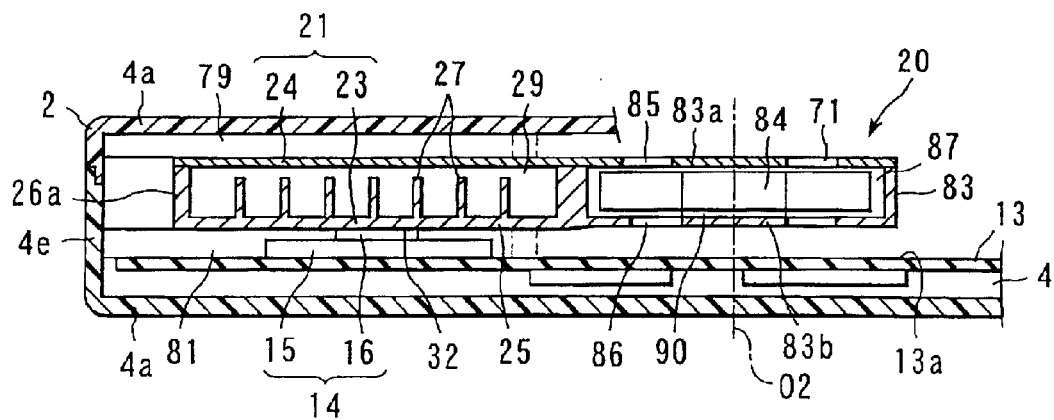
FIG. 15 is a sectional view taken along line F15—F15 of FIG. 12.

As shown in FIGS. 13 and 15, the second electromotive fan 71 is used only to draw the air within the housing 4 and discharge it to the outside of the housing 4. The second electromotive fan 71 comprises a flat-box-shaped fan casing 83, and an impeller 84 housed in the casing 83. The fan casing 83 is formed integral with the heat sink 21 and located in front of the heat sink 21.

The fan casing 83 has upper and bottom surfaces 83a and 83b. The upper surface 83a is continuous with the top plate 24 of the heat sink 21, and is located just below the left end portion of the keyboard 7. A first suction port 85 is formed in the upper surface 83a. The bottom surface 83b of the fan casing 83 opposing the upper surface 13a of the printed circuit board 13. A second suction port 86 is formed in the bottom surface 83b. The first and second suction ports 85 and 86 open to the interior of the housing 4.

A second air passage 87 is defined in the fan casing 83. The first and second suction ports 85 and 86 are located at the upstream end of the second air passage 87. Further, the second air passage 87 has a discharge port 88 at its downstream end. The discharge port 88 is adjacent to the left sidewall 4d of the housing 4 and opposes second outlets 89 formed in the sidewall 4d.

As shown in FIG. 15, the impeller 84 is contained in the fan casing 83 with its axis-of-rotation O2 positioned vertically. The impeller 84 is located at the upstream end of the second air passage 87 and between the first and second suction ports 85 and 86 of the fan casing 83.

The impeller 84 is rotated by a flat motor 90 when the temperature of the semiconductor package 14 exceeds the operation guarantee temperature. In accordance with the rotation of the impeller 84, air is introduced into the fan casing 83 through the first and second suction ports 85 and 86, and is then discharged into the second air passage 87 from the outer peripheral portion of the impeller 84.

In this structure, the heat of the IC chip 16 of the semiconductor package 14 is transmitted to the heat-receiving surface 32 of the heat sink 21 and then to the base 23 and top plate 24. The heat is then discharged from the heat sink 21 to the interior of the housing 14.

When the temperatures of the semiconductor package 14 exceeds the operation guarantee temperature, the impeller 73 of the first electromotive fan 70 rotates. In accordance with the rotation of the impeller 73, a negative pressure is created in the first and second suction ports 74 and 75, thereby introducing cold air from the outside of the housing 4 into the first and second external air introduction passages 78 and 80 through the first and second inlets 37 and 51. The air introduced into the first and second external air introduction passages 78 and 80 is guided as cooling air into the fan casing 72, where it is discharged into the first air passage 29 of the heat sink 21 from the outer peripheral portion of the impeller 73. This cooling air passes through the radiator fins 27, thereby cooling the heat sink 21.

The cooling air absorbs, by heat exchange, the heat of the IC chip 16 transmitted to the heat sink 21. The cooling air, heated as a result of the heat exchange, is discharged to the outside of the housing 4 through the discharge port 30 of the first air passage 29 and the first outlets 31.

The second electromotive fan 71 is driven in accordance with the rotation of the first electromotive fan 70. When the impeller 84 of the second electromotive fan 71 rotates, a negative pressure is created in the first and second suction ports 85 and 86, thereby introducing the air within the housing 4 into the fan casing 83. As a result, the flow of air directed to the first and second suction ports 85 and 86 occurs in the housing 4, thereby cooling the power supply unit 17. The cooling air absorbs, by heat exchange, the heat of the power supply unit 17. The cooling air, heated as a result of the heat exchange, is drawn into the first and second suction ports 85 and 86, and is then discharged to the second air passage 87 from the outer peripheral portion of the impeller 84. This air is discharged to the outside of the housing 4 through the discharge port 88 of the second air passage 87 and the second outlets 89.

In the above structure, the first electromotive fan 70 can directly supply cold air outside the housing 4 to the heat sink 21 that receives the heat of the IC chip 16. Therefore, the temperature difference between the cooling air and heat sink 21 is large, which enables efficient heat exchange between the air and heat sink 21. As a result, the IC-chip cooling performance is enhanced, and hence the operation temperature of the semiconductor package 14 can be maintained at an appropriate value.

Furthermore, since the second electromotive fan 71 discharges the air within the housing 4 to the outside of the housing 4, the air flow in the housing 4 can be maintained properly, which enables the heat generated by the power supply unit 17 to be efficiently discharged to the outside of the housing 4. As a result, the cooling performance for the power supply unit 17 is enhanced, and increases in the temperature of the housing 4 can be prevented.

Thus, the semiconductor package 14, power supply unit 17 and housing 4 can be cooled in a well-balanced manner, which enhances the heat dissipation performance of the portable computer 1.

In addition, in the above structure, the first and second electromotive fans 70 and 71 are used to supply the air outside the housing 4 to the heat sink 21, and to discharge the air within the housing 4 to the outside, respectively. Thus, the passage for introducing cooling air is isolated from that for discharging the air heated within the housing 4. This means that the flow of cooling air directed to the heat sink 21 does not interfere with the flow of the air drawn from the housing 4, thereby preventing a reduction in the air flow.

In the embodiment, the impellers 73 and 84 of the first and second electromotive fans 70 and 71 may be rotated at the same speed or different speeds. In other words, the rotational speed of each of the impellers 73 and 84 is appropriately set in light of the amount of heat generation of the semiconductor package 14 and/or the temperature distribution in the housing 4.

In the first embodiment, the heat sink is formed integral with the electromotive fan. However, the invention is not limited to this. They may be formed as independent components and arranged parallel to each other. Further, a fan attachment section, on which the electromotive fan is mounted, may be provided at the heat sink.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electronic apparatus comprising:

a housing containing a heat-generating component; and a cooling unit contained in the housing, the cooling unit including a heat sink thermally connected to the heat-generating component, a first air passage which guides air outside the housing to the heat sink and guides air heated by heat exchange with the heat sink to an outside of the housing, and a second air passage which guides air within the housing to the outside of the housing.

2. An electronic apparatus according to claim 1, wherein the housing includes inlets at an located upstream end of the first air passage, a first outlet located at a downstream end of the first air passage, and a second outlet located at a downstream end of the second air passage.

3. An electronic apparatus according to claim 1, wherein the housing includes an upper surface, and a peripheral wall extending from an outer peripheral edge of the upper surface, the inlets being formed in the upper surface and the peripheral wall of the housing, respectively.

4. An electronic apparatus according to claim 1, wherein the heat-generating component includes a first element and at least one second element, the first element generating a larger amount of heat than the second element.

5. An electronic apparatus according to claim 4, wherein the heat sink is thermally connected to the first element.

6. An electronic apparatus comprising:

a housing having a first outlet and a second outlet;

a heat-generating component contained in the housing; and a cooling unit contained in the housing, the cooling unit including a first air passage facing to the first outlet, a second air passage facing to the second outlet, a fan which guides air outside the housing into the first air passage, and also guides air within the housing into the second air passage, and a heat sink thermally connected to the heat-generating component, the heat sink being cooled by air flowing through the first air passage.

7. An electronic apparatus according to claim 6, wherein the housing includes inlets which guides air outside the housing into the housing, and external air introduction passages facing to the respective inlets, the fan includes a fan casing having suction ports, and an impeller contained in the fan casing, the impeller introducing air into the fan casing through the suction ports, the suction ports of the fan casing having respective first areas facing to the external air introduction passages, and respective second areas facing to an interior of the housing.

8. An electronic apparatus according to claim 7, wherein the external air introduction passages are isolated from the interior of the housing.

9. An electronic apparatus according to claim 7, wherein the first areas of the suction ports are larger than the second areas.

10. An electronic apparatus according to claim 7, wherein the impeller of the fan is located between the first and second air passages and surrounded by the upstream ends of the first and second air passages, the first and second air passages extending in different directions with respect to the fan casing.

11. An electronic apparatus according to claim 10, wherein the fan casing has a partition wall which isolates the upstream end of the first air passage from the upstream end of the second air passage.

12. An electronic apparatus according to claim 6, wherein the heat-generating component includes a first element and at least one second element, the first element generating a larger amount of heat than the second element, and the heat sink being thermally connected to the first element.

13. An electronic apparatus according to claim 6, wherein the housing includes a wall in which the first outlet is formed, and another wall in which the second outlet is formed.

14. An electronic apparatus according to claim 6, wherein the heat sink is interposed between the fan and the first outlet.

* * * * *